(12) United States Patent
Rahman et al.

(10) Patent No.: US 7,498,835 B1
(45) Date of Patent: Mar. 3, 2009

(54) IMPLEMENTATION OF LOW POWER STANDBY MODES FOR INTEGRATED CIRCUITS

(75) Inventors: Arifur Rahman, San Jose, CA (US); Sean W. Kao, Campbell, CA (US); Tim Tuan, San Jose, CA (US); Patrick J. Crotty, San Jose, CA (US); Jinsong Oliver Huang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 83 days.

(21) Appl. No.: 11/268,265

(22) Filed: Nov. 4, 2005

(51) Int. Cl.
*H03K 19/173* (2006.01)
*G11C 5/14* (2006.01)

(52) U.S. Cl. ............... 326/38; 326/39; 326/46; 365/226; 365/227; 365/229

(58) Field of Classification Search ............ 326/38, 326/39, 46; 365/226, 227, 229
See application file for complete search history.

(56) References Cited

U.S. PATENT DOCUMENTS

| | | | |
|---|---|---|---|
| 4,962,341 A | 10/1990 | Schoeff | |
| 5,303,390 A | 4/1994 | Little | |
| 5,362,989 A | 11/1994 | Hennedy | |
| 5,519,663 A | 5/1996 | Harper et al. | |
| 5,568,062 A | 10/1996 | Kaplinsky | |
| 5,583,457 A | 12/1996 | Horiguchi et al. | |
| 5,612,892 A | 3/1997 | Almulla | |
| 5,615,162 A | 3/1997 | Houston | |
| 5,671,149 A | 9/1997 | Brown | |
| 5,682,107 A | 10/1997 | Tavana et al. | |
| 5,712,790 A | 1/1998 | Ditlow et al. | |
| 5,801,548 A | 9/1998 | Lee et al. | |
| 5,811,962 A * | 9/1998 | Ceccherelli et al. | 323/282 |
| 5,825,662 A | 10/1998 | Trimberger | |
| 5,832,286 A * | 11/1998 | Yoshida | 713/324 |
| 5,914,873 A | 6/1999 | Blish, II | |
| 5,946,257 A | 8/1999 | Keeth | |
| 5,958,026 A | 9/1999 | Goetting et al. | |
| 6,038,386 A | 3/2000 | Jain | |
| 6,114,843 A | 9/2000 | Olah | |
| 6,148,390 A | 11/2000 | MacArthur | |

(Continued)

OTHER PUBLICATIONS

Appl. No. 10/666,669, filed Sep. 19, 2003, Tuan et al.

(Continued)

*Primary Examiner*—Vibol Tan
(74) *Attorney, Agent, or Firm*—William L. Paradice, III; Justin Liu

(57) ABSTRACT

A PLD (200) includes a power management unit (PMU 210) that selectively implements one or more different power-reduction techniques in response to power configuration signals (PC). By manipulating the PC signals, the PMU can independently enable/disable various supply voltage circuits (110, 120, 130) that power CLBs (101), IOBs (102), and configuration memory cells (106), can generate a capture signal that causes data stored in storage elements of the CLBs to be captured in configuration memory cells, and/or can switch power terminals of configuration memory cells between voltage supply circuits. Also, the PMU can sequentially apply and remove power from a number of configurable PLD portions in response to the PC signals, wherein each configurable portion may include any number of the PLD's resources.

19 Claims, 6 Drawing Sheets

U.S. PATENT DOCUMENTS

| | | | |
|---|---|---|---|
| 6,160,418 | A | 12/2000 | Burnham |
| 6,169,419 | B1 | 1/2001 | De et al. |
| 6,172,518 | B1 | 1/2001 | Jenkins, IV. et al. |
| 6,208,171 | B1 | 3/2001 | Kumagi et al. |
| 6,384,626 | B2 | 5/2002 | Tsai et al. |
| 6,920,627 | B2 | 7/2002 | Blodget et al. |
| 6,466,049 | B1 | 10/2002 | Diba et al. |
| 6,489,804 | B1 | 12/2002 | Burr |
| 6,583,645 | B1 | 6/2003 | Bennett et al. |
| 6,631,502 | B2 | 10/2003 | Buffet et al. |
| 6,710,621 | B2 * | 3/2004 | Devlin et al. ............... 326/38 |
| 6,711,719 | B2 | 3/2004 | Cohn et al. |
| 6,747,478 | B2 | 6/2004 | Madurawe |
| 6,839,888 | B2 | 1/2005 | Gupta |
| 6,885,563 | B2 | 4/2005 | Panella et al. |
| 6,936,917 | B2 | 8/2005 | Lopata et al. |
| 6,950,998 | B1 | 9/2005 | Tuan |
| 6,960,934 | B2 | 11/2005 | New |
| 6,968,467 | B2 | 11/2005 | Inoue et al. |
| 7,003,620 | B2 | 2/2006 | Avraham et al. |
| 7,078,932 | B2 * | 7/2006 | Swami ...................... 326/38 |
| 7,080,341 | B2 | 7/2006 | Eisenstadt et al. |
| 7,098,689 | B1 | 8/2006 | Tuan et al. |
| 7,109,748 | B1 | 9/2006 | Liu et al. |
| 7,112,997 | B1 | 9/2006 | Liang et al. |
| 7,135,886 | B2 | 11/2006 | Schlacter |
| 7,170,315 | B2 | 1/2007 | Bakker et al. |
| 7,313,708 | B2 | 12/2007 | Oshins |
| 2003/0030326 | A1 | 2/2003 | Shenai et al. |
| 2003/0218478 | A1 | 11/2003 | Sani et al. |
| 2004/0145955 | A1 | 7/2004 | Mizuno et al. |
| 2005/0091547 | A1 | 4/2005 | Hanrieder et al. |
| 2005/0091629 | A1 * | 4/2005 | Eisenstadt et al. ............ 716/13 |
| 2005/0201174 | A1 * | 9/2005 | Klein ....................... 365/222 |
| 2006/0053246 | A1 | 3/2006 | Lee |
| 2006/0069851 | A1 | 3/2006 | Chung et al. |
| 2006/0202713 | A1 | 9/2006 | Sergey Shumarayev |
| 2007/0001720 | A1 | 1/2007 | Li et al. |
| 2007/0164785 | A1 | 7/2007 | He |

OTHER PUBLICATIONS

Appl. No. 10/783,216, filed Feb. 20, 2004, Tuan et al.

Appl. No. 10/783,589, filed Feb. 20, 2004, Look et al.

Xilinx, Inc., "Spartan-3L Low Power FPGA Family", Preliminary Product Specificaion, DS313, Sep. 15, 2005, v1.1, pp. 1-10, available from Xilinx, Inc., 2100 Logic Drive, San Jose, CA 95124.

Intel Corporation, "Intel PXA27x Processor Family Power Requirements", Application Note, 2004, pp. 1-36, available from Intel Corporation (Santa Clara) Corporate Office, 2200 Mission College Blvd., Santa Clara, California 95052-8119.

Nowka, Kevin J., A 32-bit PowerPC System-on-a-Chip With Support For Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.

Mutoh, Shin'Ichiro et al., "1 -V Power Supply High-speed Digital Circuit Technology with Multithreshold-Voltage CMOS", IEEE Journal Of Solid-state Circuits, Aug. 1995, pp. 847-854, vol. 30, No. 8, available from IEEE, 3 Park Avenue, 17th Floor, New York, NY 10016-5997.

Inukai, T. et al., "Boosted Gate MOS (BGMOS): Device/Circuit Cooperation Scheme to Achieve Leakage-Free Giga-Scale Integration" IEEE 2000 Custom Integrated Circuits Conference, May 21-24, 2000, pp. 409-412, available from IEEE, 3 Park Avenue, 17th Floor, New York, NY 10016-5997.

Kuroda, Tadahiro et al., "A 0.9-V, 150-MHz, 10-mW, 4 mm$^2$, 2-D Discrete Cosine Transform Core Processor With Variable Threshold-Voltage (VT) Scheme", Nov. 1996, pp. 1770-1779, vol. 32, No. 11, available from IEEE, 3 Park Avenue, 17th Floor, New York, NY 10016-5997.

Hamzaoglu, Faith et al., "Circuit-Level Techniques to Control Gate Leakage for Sub-100nm CMOS", ISLPED, Aug. 12-14, 2002, pp. 60-63, available from IEEE, 3 Park Avenue, 17th Floor, New York, NY 10016-5997.

He, Lei, "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http;//eda.ee.ucla.edu/

FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.

Takahashi, M. et al., "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.

Park, Jae Y., Allen, Mark G., "A Comparison of Micromachined Inductors with Different Magnetic Core Materials"; 1996 Electronics Components and Technology Conference; 1996 IEEE; pp. 375-381. month unknown.

Burd, Thomas D., et al., "A Dynamic Voltage Scaled Microprocessor System"; 2000 IEEE; IEEE Journal of Solid-State Circuits, vol. 35, No. 11, Nov. 2000; pp. 1571-1580.

Stratakos, Anthony J., et al., "A Low-Voltage CMOS DC-DC Converter for a Portable Battery-Operated System"; 1994 IEEE; Jun. 20-25, 1994, pp. 619-626.

Stratakos, Anthony John, "High-Efficiency Low-Voltage DC-DC Conversion for Portable Applications," Chapter 3; "DC-DC Converter Fundamentals", Ph. D. dissertation, UC, Berkeley, CA 1999, pp. 42-78 month unknown.

U.S. Appl. No. 10/606,619 filed Jun. 26, 2003, New, Bernie et al., entitled "Integrated Circuit with High-Voltage, Low-Current Power Supply Distribution and Methods of Using the Same", Xilinx, Inc., San Jose, CA 95124.

U.S. Appl. No. 11/325,888 filed Jan. 4, 2006, Tuan, Tim, entitled "Programmable Low Power Modes For Embedded Memory Blocks", Xilinx Inc., San Jose, CA 95124.

U.S. Appl. No. 11/326,542 filed Jan. 4, 2006, Jacobson, Neil G., et al., entitled "Method and Mechanism for Controlling Power Consumption of an Integrated Circuit", Xilinx, Inc., San Jose, CA 95124.

U.S. Appl. No. 11/502,939 filed Aug. 11, 2006, Tuan, Tim et al., entitled "Disabled Unused/Inactive Resources in Programmable Logic Devices for Static Power Reduction", Xilinx, Inc., San Jose, CA 95124.

Texas Instruments (Benchmarq) - Datasheet BQ4011 (32x8 nonvolatile SRAM) Aug. 1993, pp. 1-11.

Texas Instruments - Datasheet BQ4011 (32x8 nonvolatile SRAM) May 1999, pp. 1-15.

Allen/Holberg, Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.

Xilinx, Inc.., "Virtex-II Pro Platform FPGA Handbook"; published Oct. 14, 2002; available from Xilinx, Inc., 2100 Logic Drive, San Jose, CA 95124; pp. 19-71.

U.S. Appl. No. 10/971,934 filed Oct. 22, 2004, Jenkins, Jesse H. IV, entitled "Low Power Zones For Programmable Logic Devices", Xilinx, Inc., San Jose, CA 95124.

U.S. Appl. No. 11/502,939 filed Aug. 11, 2006, Tuan, Tim, et al., entitled "Disabled Unused/Inactive Resources in Programmable Logic Devices for Static Power Reduction", Xilinx, Inc., San Jose, CA 95124.

U.S. Appl. No. 11/329,646 filed Jan. 11, 2006, Jenkins, Jesse H. IV, entitled "Programmable Detection of Power Failure in an Integrated Circuit", Xilinx, Inc., San Jose, Ca 95124.

Microchip Technology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28.

* cited by examiner

IMPLEMENTATION OF LOW POWER STANDBY MODES FOR INTEGRATED CIRCUITS

RELATED APPLICATIONS

This application is related to co-pending and commonly-owned U.S. patent application Ser. No. 10/666,669 entitled "Disabling Unused/inactive Resources In Programmable Logic Devices For Static Power Reduction" filed Sep. 19, 2003; U.S. patent application Ser. No. 10/783,216 entitled "Tuning Programmable Logic Devices For Low-Power Design Implementation" filed Feb. 20, 2004, and U.S. patent application Ser. No. 10/783,589 entitled "Regulating Unused/Inactive Resources In Programmable Logic Devices For Static Power Reduction" filed Feb. 20, 2004, each of which are incorporated herein by reference in its entirety.

FIELD OF THE INVENTION

The present invention relates generally to power supply regulation and distribution systems in integrated circuit (IC) devices, and more specifically to selectively adjusting the power provided to various portions of an IC device.

BACKGROUND

A programmable logic device (PLD) is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated configuration memory cells that control various switches and multiplexers within the CLBs, IOBs, and the interconnect structure to implement logic and routing functions specified by the configuration data.

PLDs such as FPGA devices typically exhibit greater static power consumption than dedicated logic devices such as standard-cell application specific integrated circuits (ASICs). One reason for the PLD's high power consumption is because while the PLD utilizes only a subset of its available resources for any given design, the unused resources nevertheless consume static power. As a result, PLDs are sometimes not suitable for low-power applications such as, for example, portable devices. Further, as known in the art, core logic elements such as the CLBs and embedded memory elements such as Block RAM and the configuration memory cells of a PLD may account for a significant portion of the PLD's static power consumption. Indeed, leakage currents associated with volatile memory elements such as DRAM cells and/or SRAM cells consume static power even when not actively used by the PLD. Similarly, leakage currents associated with the PLD's core logic elements consume static power even when not actively used by the PLD.

One technique to reduce power consumption when the PLD is not being actively used (during a standby mode) is to remove power from the PLD and thereby power-down the PLD's various components. Although effective in minimizing static power consumption during standby mode, powering-down various PLD various components such as the configuration memory cells causes data stored therein to be lost, and therefore requires the PLD to be re-configured (e.g., from an external memory) prior to subsequent use.

Therefore, there is a need for a PLD to implement more effective power reduction techniques during standby mode.

SUMMARY

A method and apparatus are disclosed that may reduce the static power consumption of an integrated circuit such as a PLD or an FPGA during standby mode, and may also allow a user to select one or more different power-reduction techniques to employ during standby mode. In accordance with the present invention, an integrated circuit includes a power management unit having an input to receive a standby signal, a control terminal to receive one or more power configuration signals, and first outputs to provide a first enable signal to a first voltage supply circuit that provides a first voltage to logic blocks of the integrated circuit, and to provide a second enable signal to a second voltage supply circuit that provides a second voltage to configuration memory cells of the integrated circuit. For some embodiments, the power management unit may also include second outputs to provide a capture or readback signal to one or more storage elements provided with the logic blocks and to one or more selected configuration memory cells. For some embodiments, the power management unit may include an output to provide a switch signal to a switching circuit that causes the configuration memory cells to be selectively powered by either the first voltage supply circuit or by the second voltage supply circuit. For some embodiments, the power management unit may include an output to provide switch signals to switching circuits that cause one or more of the storage elements provided within the logic blocks to be selectively powered by either the first voltage supply or by the second voltage supply.

The power configuration signals determine which one(s) of the power-reduction techniques the power management unit implements during standby mode to reduce the static power consumption of the integrated circuit. More specifically, when the standby signal is asserted, the integrated circuit enters the standby mode, and the power management unit may be configured to selectively employ one or more power-reduction techniques in response to the power configuration signals.

In accordance with other embodiments of the present invention, the power management unit may also be used to apply power to different portions of the integrated circuit in a sequential manner when the integrated circuit transitions from standby mode to normal mode to avoid undesirable current spikes that may occur if power is simultaneously returned to all portions. In some embodiments. gating circuits may be used to couple each of the configurable portions to an associated power rail. The gating circuits may be independently controlled by the power management unit so that power may be independently provided to each of the configurable portions.

BRIEF DESCRIPTION OF THE DRAWINGS

Like reference numerals refer to corresponding parts throughout the drawing figures.

DETAILED DESCRIPTION

Embodiments of the present invention are described below in the context of an exemplary FPGA architecture for simplicity only. It is to be understood that present embodiments are equally applicable to other PLD architectures such as FPGAs and complex PLDs, and to other types of integrated circuits including, for example, application-specific integrated circuit (ASIC) devices and partially programmable devices. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Figure 1A:
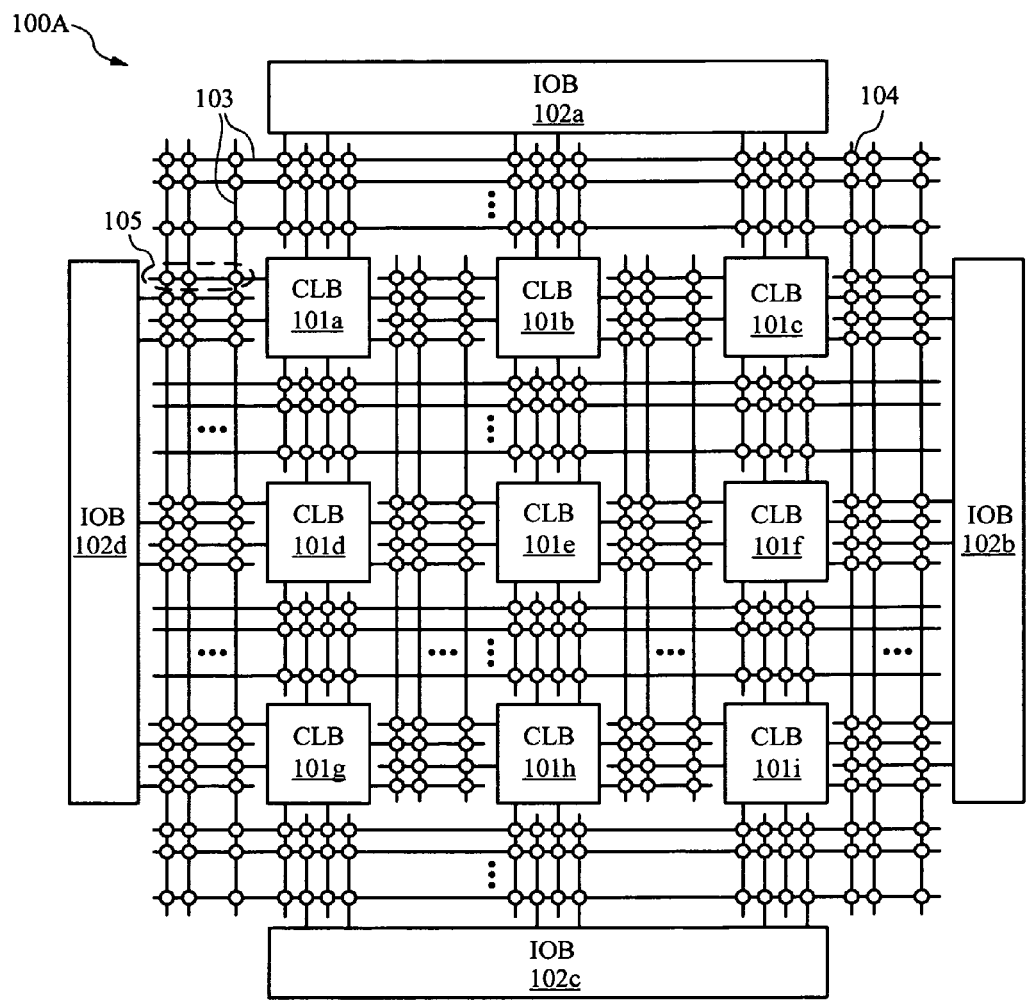
FIG. 1A is simplified block diagram of a FPGA architecture within which embodiments of the present invention may be implemented.

FIG. 1A is a simplified block diagram of an exemplary FPGA architecture 100A. FPGA 100A includes an array of configurable logic blocks (CLBs) 101a-101i and programmable input/output blocks (IOBs) 102a-102d. The CLBs 101 and IOBs 102 are selectively interconnected by a programmable interconnect structure that includes a plurality of interconnect lines 103 interconnected by a number of programmable interconnect points (PIPs) 104. The PIPs 104 are often arranged in groups (e.g., group 105) to implement multiplexer circuits that select one of several interconnect lines to provide a signal to a destination interconnect line or logic block. CLBs 101 are individually programmable and can be configured to perform a variety of logic functions on a few input signals. IOBs 102 can be configured to drive output signals from CLBs 101 to external pins (not shown for simplicity) of the FPGA and/or to receive input signals from the external FPGA pins. The CLBs 101, IOBs 102, and the general interconnect structure (e.g., PIPs 104) may be programmed by loading configuration data into associated configuration memory cells (not shown in FIG. 1A for simplicity) that control various switches, multiplexers, and other elements within the CLBs, IOBs, and the interconnect structure to implement a user circuit design embodied by the configuration data. Although a particular FPGA layout is illustrated in FIG. 1A, it is to be understood that many other FPGA layouts are possible, and are considered to fall within the scope of the present invention. For example, other embodiments can have other numbers of CLBs 101, IOBs 102, interconnect signal lines 103, and PIPs 104, and can have other types of blocks, such as block RAMs, DLL circuits, embedded processors, and the like.

Figure 1B:
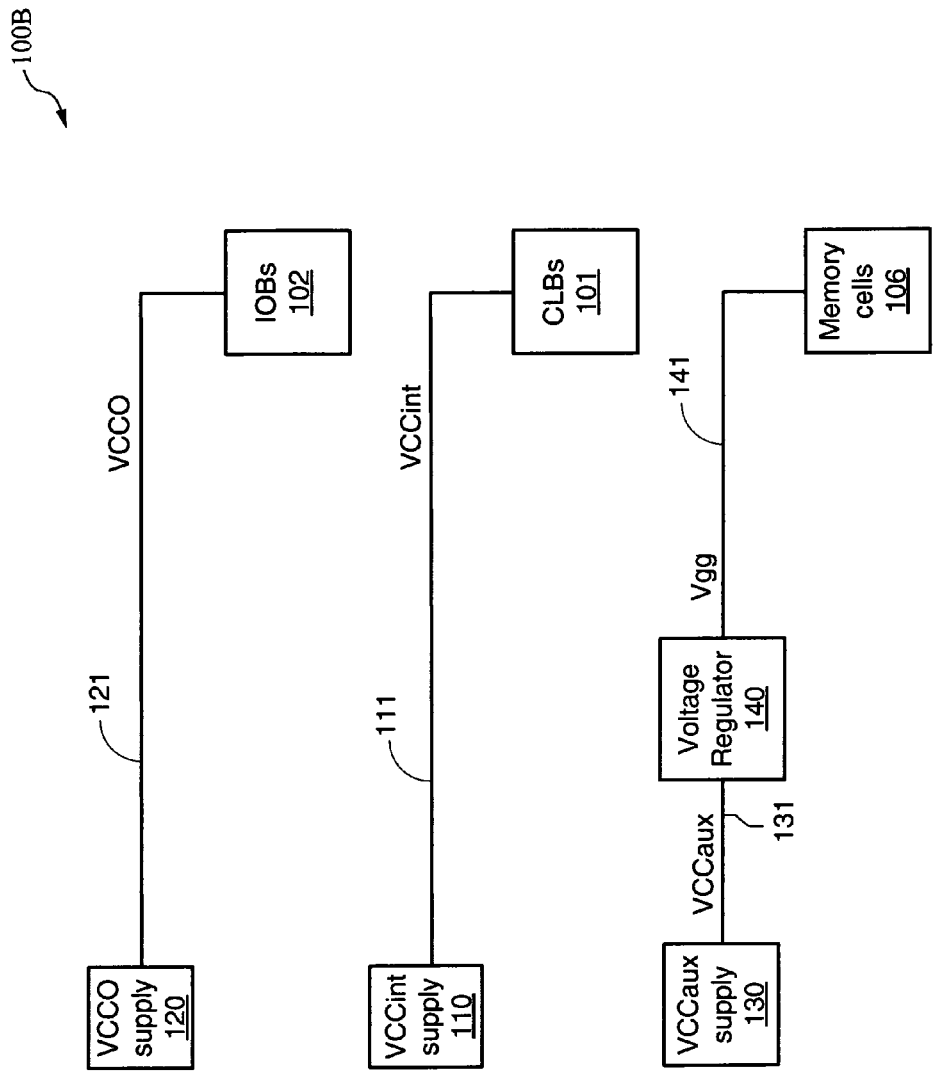
FIG. 1B is a block diagram illustrating a power distribution system of the FPGA architecture of FIG. 1A.

Many FPGA architectures include multiple voltage domains that are powered by various different operating voltages and organized into various arrangements. More specifically, for some FPGA devices, I/O circuitry such as IOBs 102 may be powered by a main voltage supply, core logic elements such as CLBs 101 may be powered by a separate internal voltage supply, and memory elements such as the configuration memory cells may be powered by yet another separate regulated voltage. For example, FIG. 1B shows an FPGA 100B that is generally illustrative of the power distribution system utilized by the Spartan-3 series of FPGA devices offered by Xilinx, Inc., which is the assignee of the present invention. FPGA 100B is shown to include an internal voltage (VCCint) supply circuit 110, a main voltage (VCCO) supply circuit 120, an auxiliary voltage (VCCaux) supply circuit 130, and a voltage regulator circuit 140. VCCint supply circuit 110 provides an internal core operating voltage VCCint to power terminals of resources such as CLBs 101 via a first power rail 111. VCCO supply circuit 120 provides a main operating voltage VCCO to power terminals of resources such as IOBs 102 via a second power rail 121. VCCaux supply circuit 130 provides an auxiliary operating voltage VCCaux to an input terminal of voltage regulator 140 via a third power rail 131. Voltage regulator circuit 140, which is well-known, regulates VCCaux to provide a regulated operating voltage (Vgg) to power terminals of resources such as memory cells 106 via power rail 141. Memory cells 106, which are generally representative of configuration memory cells that store configuration data for the FPGA, may be any suitable type of memory cell including, for example, SRAM or DRAM cells.

For purposes of discussion herein, VCCO has a voltage between approximately 2.5-3.3 volts, VCCint has a voltage of between approximately 1.0-1.2 volts, VCCaux has a voltage of approximately 2.5 volts, and voltage regulator 140 regulates Vgg to between approximately 1.3-1.5 volts (which is approximately one transistor threshold voltage (VT) above VCCint). As depicted in FIG. 1B, voltage regulator 140 is powered from a voltage supply VCCaux that is different than the main operating voltage supply VCCO. Utilizing separate supply circuits to generate VCCO and VCCaux allows voltage regulator 140 to be designed for a specific supply voltage (i.e., VCCaux), and allows VCCO to vary depending upon desired I/O signal switching characteristics for IOBs 102. However, for other embodiments, the input of voltage regulator 140 may receive VCCO from supply circuit 120 via power rail 121, and VCCaux supply circuit 130 may be eliminated.

When the FPGA is not actively being used by a host system, the FPGA may be placed in a standby mode to reduce static power consumption. For example, an FPGA in a mobile phone may be placed in standby mode when the phone is in a sleep mode. One technique to reduce power consumption when the FPGA is not being actively used is to remove power from the FPGA, thereby essentially causing VCCO, VCCint, and Vgg to be reduced to a negligible level that disables the IOBs 102, the CLBs 101, and the memory cells 106. Although effective in minimizing static power consumption during standby mode, disabling the IOBs 102, CLBs 101, and configuration memory cells 106 causes data stored therein to be lost, and therefore requires the FPGA to be re-configured (e.g., from an external memory) prior to subsequent use.

Another power reduction technique is to selectively reduce the operating voltage Vgg provided to the memory cells 106 during standby mode to a level that reduces static power consumption of memory cells 106 but that is sufficient to retain data stored in the memory cells 106. For example, voltage reduction circuits may be positioned between the power terminals of the memory cells and the power rail (i.e., Vgg) to selectively provide one or more diode drops between the power rail and the memory cell power terminals during standby mode to reduce the value of Vgg to a level that reduces static power consumption while retaining data stored in the memory cells. Although using voltage reduction circuits to selectively reduce the level of Vgg provided to memory cells 106 during standby mode reduces static power consumption of the memory cells 106, voltage regulator 140 (which is powered by VCCaux≈2.5 volts) still consumes a significant amount of power during standby mode.

Figure 2:
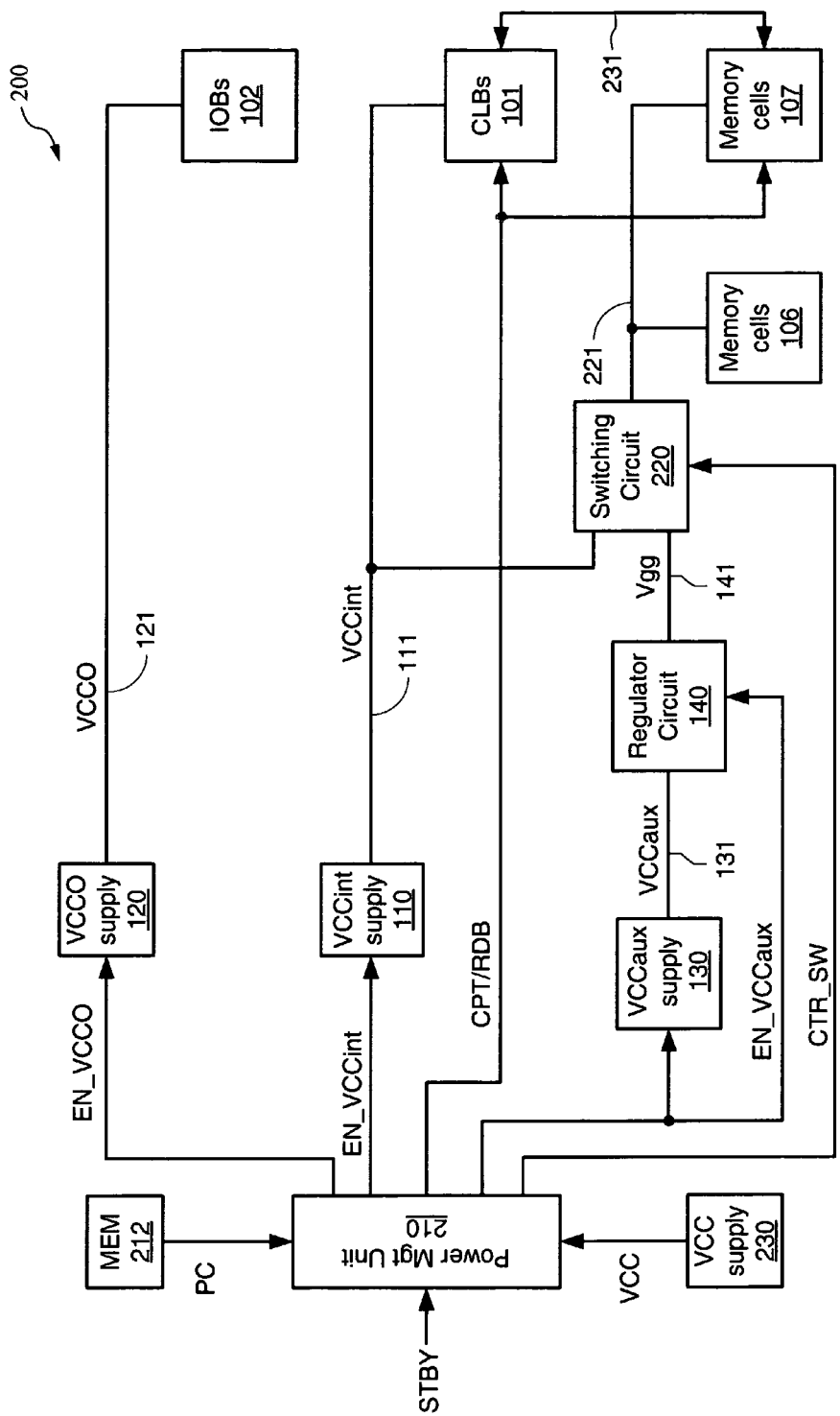
FIG. 2 is a block diagram illustrating a configurable power distribution system for some embodiments of the FPGA architecture of FIG. 1A.

Therefore, in accordance with some embodiments of the present invention, a power management unit is provided on the FPGA to implement one or more user-selectable power-reduction techniques when the FPGA is not being actively used, for example, by a host system. FIG. 2 shows a simplified functional diagram of an FPGA 200 in accordance with some embodiments of the present invention. In addition to all the elements of FPGA 100B of FIG. 1B, FPGA 200 includes memory cells 107, a power management unit 210, an associated memory circuit 212, a switching circuit 220, and VCC supply circuit 230. Power management unit 210 includes a input to receive a standby signal (STBY), a control input to receive one or more power configuration signals (PC) from memory circuit 212, and includes outputs to provide an enable signal (EN_VCCint) to VCCint supply circuit 110, to provide an enable signal (EN_VCCO) to VCCO supply circuit 120, to provide an enable signal (EN_VCCaux) to VCCaux supply circuit 130 and to regulator circuit 140, to provide a switching control signal (CTR_SW) to switching circuit 220, and to provide a capture signal (CPT) and a read-back signal (RDB) to CLBs 101 and to memory cells 107. For some embodiments, power management unit 210 may be implemented as a finite state machine that drives EN_VCCO, EN_VCCint, EN_VCCaux, CPT, RDB, and/or CTR_SW to various selectable states when the FPGA enters a standby mode to implement one more selectable power reduction techniques during standby mode.

For the exemplary embodiment shown in FIG. 2, power management unit 210 is powered by an operating voltage (VCC) provided by a voltage supply circuit 230 that is separate from voltage supply circuits 110, 120, and 130. In this manner, power management unit 210 may remain operational via VCC during standby modes in which one or more of voltage supply circuits 110, 120, and/or 130 may be disabled. For some embodiments, power management unit 210 may be implemented using low-leakage transistors to minimize the power consumption of power management unit 210. For other embodiments, power management unit 210 may be powered by an existing operating voltage (e.g., VCCint or VCCO) that is not disabled during standby mode.

For some embodiments, power management unit 210 may be implemented as a soft solution using any number of the FPGA's configurable resources such as, for example, CLBs 101, IOBs 102, and/or the block RAM elements (not shown in FIG. 2 for simplicity). Preferably, the resources selected to implement power management unit 210 are powered by voltage supply circuit 230 so that the operating voltage (VCC) provided thereby is not affected during standby mode. In this manner, power management unit 210 remains powered and thus fully operational during standby mode. For other embodiments, power management unit 210 may be implemented as a hard solution, for example, using an embedded processor such as the well-known Power PC processor from IBM (not shown for simplicity) that is provided in many FPGA devices available from Xilinx Inc.

The standby signal STBY, which causes FPGA 200 to transition between normal mode and standby mode, may be provided to power management unit 210 by any suitable associated circuitry (not shown for simplicity). For one embodiment, STBY may be externally generated (e.g., by a host system connected to FPGA 200) and provided to FPGA 200 via a suitable I/O pin (not shown for simplicity). For another embodiment, STBY may be generated on-chip. For some embodiments, STBY may be generated in response to observed operating conditions of FPGA 200 (e.g., gathered by monitoring the FPGA's I/O pins for activity, monitoring the FPGA's supply voltage, and/or other suitable techniques).

Memory circuit 212, which may employ any suitable memory architecture and may utilize any suitable type of memory cell including, for example, PROM, EPROM, EEPROM, flash memory, DRAM, SRAM, and the like, stores the PC signals that select which power-reduction technique(s) power management unit 210 employs during standby mode. For some embodiments, the PC signals may be stored in memory circuit 212 during configuration of the FPGA 200, for example, by including the PC signals in the configuration data (e.g., configuration bitstream) that configures FPGA 200 to a desired state. For other embodiments, the PC signals may be stored in memory circuit 212 during run time using well-known techniques. For still other embodiments, the PC signals may be provided directly to power management unit 210 during run time via corresponding I/O pins (not shown for simplicity) of the FPGA.

Switching circuit 220 includes a first power terminal to receive Vgg from regulator circuit 140 via power rail 141, a second power terminal to receive VCCint via power rail 111, a third power terminal coupled to power terminals of memory cells 106 and memory cells 107 via power rail 221, and a control terminal to receive CTR_SW from power management unit 210. Switching circuit 220 may include any suitable circuitry capable of providing either VCCint or Vgg to memory cells 106 and 107 via power rail 221 in response to CTR_SW. For example, although not shown for simplicity, for some embodiments switching circuit 220 may include first and second power transistors, where the first power transistor is coupled between power rails 111 and 221 and includes a gate to receive CTR_SW, and the second power transistor is coupled between power rails 141 and 221 and includes a gate to receive a complement of CTR_SW.

Memory cells 107, which may be any suitable memory cells such as SRAM cells, DRAM cells, latches, or registers, have power terminals coupled to power rail 221, include a data terminal coupled to CLBs 101 via signal lines 231, and include a control terminal to receive CPT and RDB from power management unit 210. For some embodiments, configuration memory cells 106 may be utilized as memory cells 107. More specifically, for one embodiment, a selected set of configuration memory cells 106 may be designated as special memory cells that store data captured from CLBs 101 during standby mode.

In accordance with the present invention, power management unit 210 may be used to selectively implement one or more different power-reduction techniques in response to the PC signals stored in memory circuit 212 when FPGA 200 enters a standby mode during which its resources are not actively used (e.g., by the host system). For example, when FPGA 200 is in the normal operational mode, STBY is de-asserted (e.g., to logic low). In response to the de-asserted state of STBY, power management unit 210 asserts (e.g., to logic high) EN_VCCO, EN_VCCint, and EN_VCCaux, de-asserts (e.g., to logic low) CPT and RDB, and drives CTRL_SW to a first state (e.g., logic low). The asserted state of EN_VCCO enables VCCO supply circuit 120 to provide VCCO to IOBs 102 via power rail 121, thereby enabling IOBs 102 to operate in a normal manner. The asserted state of EN_VCCint enables VCCint supply circuit 110 to provide VCCint to CLBs 101 via power rail 111, thereby enabling CLBs 101 to operate in a normal manner. The asserted state of EN_VCCaux enables VCCaux supply circuit 130 to provide VCCaux to voltage regulator 140, and also enables voltage regulator 140 to operate in a normal manner. When enabled, voltage regulator 140 regulates VCCaux to generate Vgg on power rail 141. The first state of CTR_SW causes switching circuit 220 to couple power rail 221 to power rail 141, thereby providing Vgg to the power terminals of memory cells 106 and to the power terminals of memory cells 107. When powered by Vgg, memory cells 106 and memory cells 107 may perform read and write operations in a normal manner.

When STBY is asserted (e.g., to logic high), FPGA 200 enters the standby mode, and power management unit 210 may be configured to selectively employ one or more power-reduction techniques in response to the PC signals to reduce the static power consumption of the FPGA, as described below. For all of the exemplary power reduction techniques described herein and implemented by power management unit 210, power management unit 210 de-asserts EN_VCCO in response to asserted state of STBY. The de-asserted state of EN_VCCO disables VCCO supply circuit 120 to reduce VCCO to a negligible level, thereby powering down IOBs 102 to minimize the static power consumption of IOBs 102. When the PC signals are set to a first state, the asserted state of STBY causes power management unit 210 to de-assert EN_VCCint (e.g., to logic low) and to de-assert EN_VCCaux (e.g., to logic low). The de-asserted state of EN_VCCint disables VCCint supply circuit 110 to reduce VCCint to a negligible level, thereby powering down CLBs 101 to minimize the static power consumption of CLBs 101. The de-asserted state of EN_VCCaux disables VCCaux supply circuit 130 and thereby prevents VCCaux from being provided to voltage regulator 140 via power rail 131. The de-asserted state of EN_VCCaux also disables regulator circuit 140, thereby reducing Vgg to a negligible level and minimizing the static power consumption of voltage regulator 140. Because voltage regulator 140 is normally powered by VCCaux, which is typically a relatively high supply voltage (e.g., VCCaux≈2.5 volts for purposes of discussion herein), disabling voltage regulator 140 during standby mode may result in a significant reduction in the FPGA's static power consumption, as compared to prior techniques. Further, by reducing Vgg to a negligible level, the static power consumption of memory cells 106 and memory cells 107 is minimized during the standby mode.

However, reducing the supply voltage to memory cells 106 and memory cells 107 to a negligible level during standby mode causes data stored in memory cells 106 and in memory cells 107 to be lost, and therefore the FPGA must be re-configured (e.g., to load configuration data into memory cells 106) prior to subsequent use.

Thus, for some embodiments, data stored in memory cells 106 and in memory cells 107 may be retained during standby mode by setting the PC signals to a second state that de-asserts EN_VCCO, de-asserts VCCaux, drives CTR_SW to a second state (e.g., logic high), and maintains EN_VCCint in its asserted state so that the VCCint supply circuit 110 continues to supply the full value of VCCint onto power rail 111, which in turn allows storage elements within CLBs 101 to retain dynamic data stored therein. As described above, the de-asserted state of EN_VCCO disables VCCO supply circuit 120 to reduce VCCO to a negligible level and thereby minimizes power consumption of IOBs 102, and the de-asserted state of EN_VCCaux disables VCCaux supply circuit 130 and voltage regulator 140 to minimize power consumption of voltage regulator 140. The second state of CTR_SW causes switching circuit 220 to couple power rail 221 to power rail 111 so that VCCint, which is enabled by the asserted state of EN_VCCint, is provided to the power terminals of memory cells 106 and memory cells 107. Although typically insufficient to enable read and write operations in memory cells 106 and memory cells 107, VCCint is sufficient to retain data stored in memory cells 106 and memory cells 107. Thus, by effectively switching the supply voltage on power rail 221 from Vgg (e.g., approximately 1.5 volts) to VCCint (e.g., approximately 1.2 volts), the static power consumption of memory cells 106 and memory cells 107 may be reduced without losing data stored therein. Further, by disabling voltage regulator 140, the reduction in static power consumption during standby mode is greater than prior techniques that merely step down the operating voltage provided to the memory cells rather than disabling the voltage regulator that generates the operating voltage.

For other embodiments, dynamic data stored in the CLBs 101 may be captured in memory cells 107 during standby mode by setting the PC signals to a third state. More specifically, setting the PC signals to the third state causes power management unit 210 to de-assert EN_VCCO, to de-assert EN_VCCint, to assert CPT (e.g., to logic high), to maintain EN_VCCaux in its asserted state, and to maintain CTR_SW in the first state during the standby mode. As described above, the de-asserted state of EN_VCCO disables VCCO supply circuit 120 to reduce VCCO to a negligible level and thereby minimize power consumption of IOBs 102, and the de-asserted state of EN_VCCint disables VCCint supply circuit 110 to reduce VCCint to a negligible level and thereby minimize power consumption of CLBs 101 during standby mode. The first state of CTR_SW causes switching circuit 220 to couple power rail 221 to power rail 141 so that Vgg, which as described above is regulated from VCCaux by voltage regulator 140, is provided to the power terminals of memory cells 106 and memory cells 107 to enable memory cells 106 and memory cells 107 for normal operation. The asserted state of CPT causes data stored in CLBs 101 to be captured in memory cells 107.

Figure 3A:
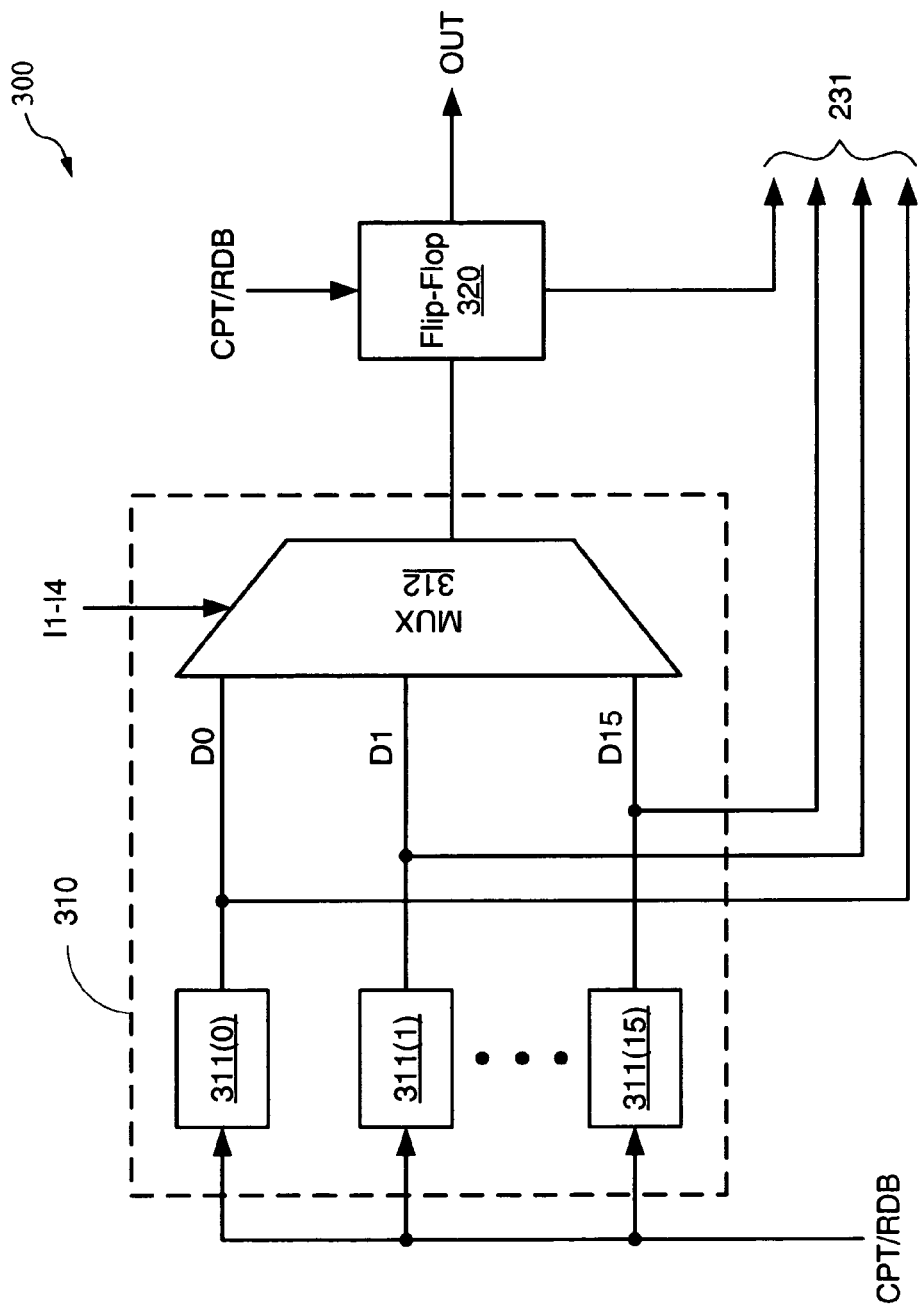
FIG. 3A is a simplified functional block diagram of one embodiment of a slice of the CLBs of the FPGA architecture of FIG. 1A.

For example, FIG. 3A is simplified functional diagram of a slice 300 that is one embodiment of the slices that may be implemented in CLBs 101. Slice 300 is shown to include a well-known 4-input look-up table (LUT) 310 and a well-known flip-flop 320. LUT 310 includes sixteen memory elements 311(0)-311(15), each coupled to a corresponding input of a multiplexer (MUX) 312. Memory elements 311(0)-311(15), which may be any suitable storage elements such as SRAM cells or DRAM cells, store data bits D0-D15, respectively, which may be loaded into memory elements 311(0)-311(15) in any well-known manner (e.g., during configuration of the FPGA). MUX 312 includes an output coupled to a data input of flip-flop 320, and includes a control terminal to receive four input signals I1-I4 that select which of data bits D0-D15 is provided to flip-flop 320 via MUX 312. Flip-flop 320 latches the data bit output by MUX 312 in response to I1-I4, and provides this data bit as an output signal OUT. For simplicity, other well-known components of CLB slice 300 are not shown in FIG. 3A. Further, although shown in the exemplary embodiment of FIG. 3A as including sixteen memory elements 311, for other embodiments, LUT 310 may include other numbers of memory elements 311 to store other suitable numbers of data bits.

In accordance with some embodiments of the present invention, memory elements 311 and flip-flop 320 include a control terminal to receive the CPT and RDB signals. For example, when power management unit 210 asserts CPT during standby mode, the asserted state of CPT may be used as a well-known read or clocking signal that causes data D0-D15 stored in memory elements 311 and/or data stored in flip-flop 320 to be read out to memory cells 107 via signal lines 231, and the asserted state of CPT may also be used as a well-known write or enable signal that causes the data to be written into memory cells 107. In this manner, when CLBs 101 are powered-down during standby mode (e.g., by disabling the VCCint supply circuit 110 so that VCCint is reduced to a negligible level), dynamic data stored in various storage elements (e.g., memory cells 311 and/or flip-flop 320) of slice 300 of CLBs 101 may be captured in memory cells 107, thereby preserving such data during standby mode. Subsequently, when STBY is de-asserted to return the FPGA to its normal operational mode, power management unit 210 may assert RDB which may be used as a well-known read or clocking signal to cause data stored in memory cells 107 to be read out to memory elements 311 and/or flip-flop 320. The asserted state of RDB may be used as a well-known write or enable signal that causes the data to be re-loaded into corresponding memory elements 311 and/or flip-flop 320 of slice 300.

For other embodiments, the power terminals of storage elements within CLBs 101 may be switched to a separate operational voltage during standby mode by setting the PC signals to a fourth state to allow such storage elements to retain data stored therein even when VCCint is reduced to a negligible level. More specifically, setting the PC signals to the fourth state causes power management unit 210 to de-assert EN_VCCO, to de-assert EN_VCCint, to maintain EN_VCCaux in its asserted state, and to maintain CTR_SW in the first state during the standby mode. As described above, the de-asserted state of EN_VCCO disables VCCO supply circuit 120 to minimize power consumption of IOBs 102, and the de-asserted state of EN_VCCint disables VCCint supply circuit 110 to minimize power consumption of CLBs 101 during standby mode. The first state of CTR_SW causes switching circuit 220 to couple power rail 221 to power rail 141 so that Vgg, which as described above is regulated from VCCaux by voltage regulator 140, is provided to the power terminals of memory cells 106 and memory cells 107 to enable memory cells 106 and memory cells 107 for normal operation. The de-asserted state of EN_VCCint also causes storage elements within CLBs 101 to be powered by Vgg instead of by VCCint so that such storage elements are able to retain data stored therein even when CLBs 101 are effectively disabled.

Figure 3B:
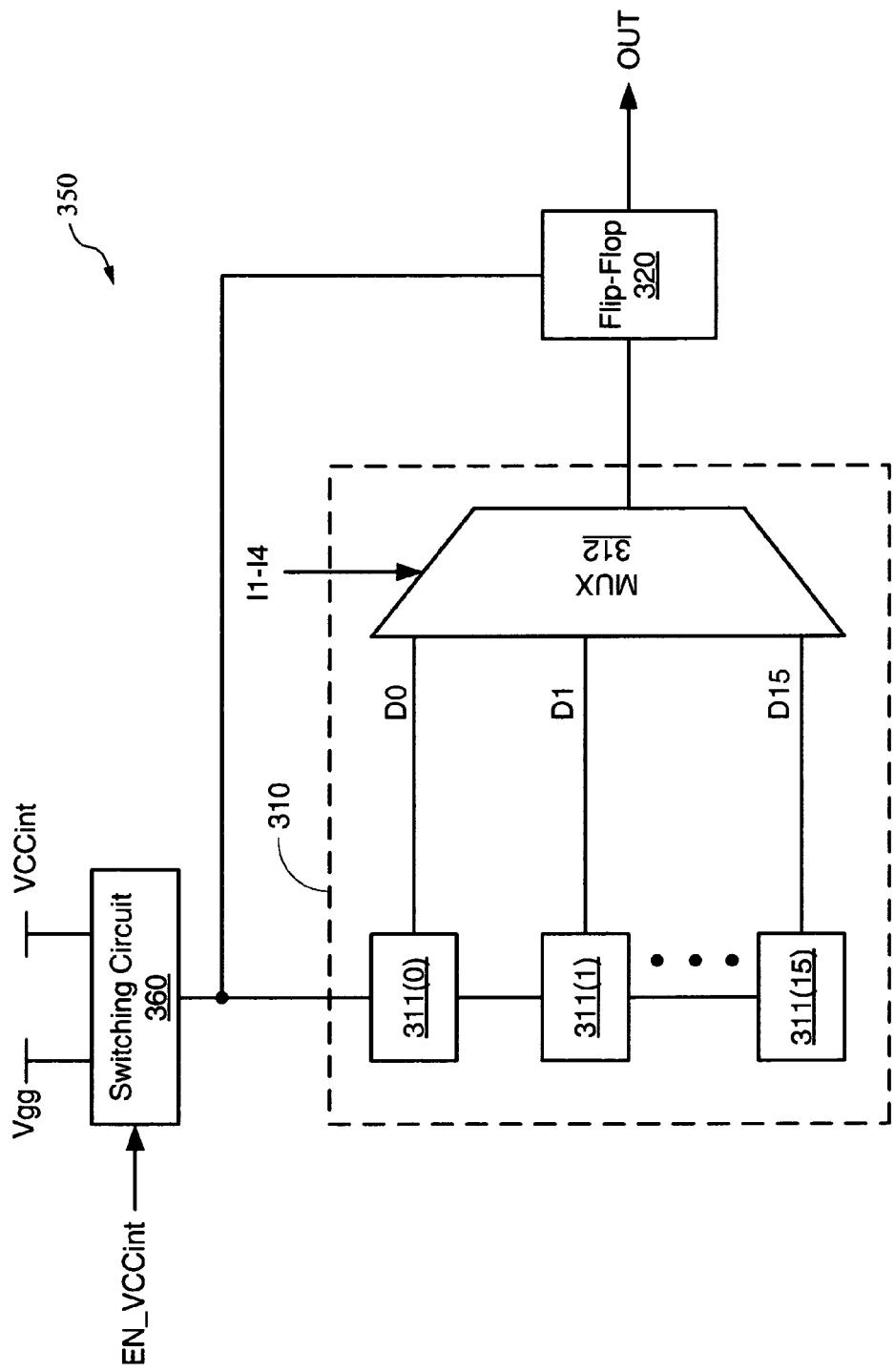
FIG. 3B is a simplified functional block diagram of another embodiment of a slice of the CLBs of the FPGA architecture of FIG. 1A.

For example, FIG. 3B is simplified functional diagram of a slice 350 that is another embodiment of the slices in CLBs 101. Slice 350 is similar to slice 300 of FIG. 3A, except that slice 350 includes a switching circuit 360 having a first power terminal coupled to Vgg (i.e., via power rail 141), a second power terminal coupled to VCCint (i.e., via power rail 111), a third power terminal coupled to the power terminals of memory elements 311 and flip-flop 320, and a control terminal to receive EN_VCCint. Switching circuit 360 may include any suitable circuitry capable of providing either VCCint or Vgg to memory elements 311 and flip-flop 320 in response to EN_VCCint. For example, although not shown for simplicity, for some embodiments switching circuit 360 may include first and second power transistors, where the first power transistor is coupled between power rail 111 and the power terminals of memory elements 311 and flip-flop 320 and includes a gate to receive EN_VCCint, and the second power transistor is coupled between power rail 141 and the power terminals of memory elements 311 and flip-flop 320 and includes a gate to receive a complement of EN_VCCint.

When the FPGA is in the normal operational mode, for example, as indicated by a de-asserted STBY signal, power management unit 210 asserts EN_VCCint, which in addition to enabling VCCint supply circuit 110 to provide VCCint to CLBs 101, also causes switching circuit 360 to couple the power terminals of memory elements 311 and flip-flop 320 to VCCint. Conversely, when STBY is asserted to initiate the standby mode, the de-asserted state of VCCint causes switching circuit 360 to couple the power terminals of memory elements 311 and flip-flop 320 to Vgg, which is sufficient to allow memory elements 311 and flip-flop 320 to retain data stored therein during the standby mode.

As described above, power management unit 210 may be implemented by a finite state machine selectively configured by the PC signals stored in memory circuit 212 to implement one or more different techniques to reduce the FPGA's static power consumption during standby mode. In this manner, a customer is able to select which power reduction technique(s) are employed during standby mode to achieve a suitable balance between static power reduction during standby mode and the time required to return the FPGA to its normal operational mode. For example, to achieve a maximum reduction in static power consumption during standby mode, the PC signals may be set to the first state, which as described above reduces VCCO, VCCint, and VCCaux to negligible levels, disables regulator circuit 140, and reduces Vgg to a negligible level, but requires a complete re-configuration of the FPGA (i.e., from an external source) prior to subsequent operation. Conversely, to reduce static power reduction during standby mode while allowing the FPGA to return to normal operation without having to be re-configured, the PC signals may be set to either the second, third, or fourth states, which as described above allow configuration data stored in configuration memory cells 106 to be retained during standby mode. Because power management unit 210 may be implemented using any suitable finite state machine, specific implementations of power management unit 210 are not disclosed herein for brevity.

The various power reduction techniques implemented by power management unit 210 in response to the power configuration signals (PC) are summarized below in Table 1, where the configuration memory cells 106 and 107 are collectively referred to as CMC.

TABLE 1

| Power Red. Mode | Actions | Power Savings | Notes |
|---|---|---|---|
| None | Enable VCCO, VCCint, and EN_VCCaux; drive CTR_SW to first state | none | All FPGA resources enabled |
| One | Disable VCCO, VCCint, VCCaux, and Vgg voltage regulator | Minimize power consumption of IOBs, CLBs, Vgg voltage regulator, and all CMCs | All FPGA resources disabled; lose dynamic data stored in CLBs and lose config. data stored in CMCs |

TABLE 1-continued

| Power Red. Mode | Actions | Power Savings | Notes |
|---|---|---|---|
| Two | Disable VCCO, VCCaux, and Vgg voltage regulator; enable VCCint; drive CTR_SW to second state | Minimize power consumption of IOBs and Vgg voltage regulator; reduce power consumption of CMCs | IOBs and Vgg regulator disabled; CLBs enabled; switch power of CMCs from Vgg to VCCint, thereby retaining data stored in CMCs |
| Three | Disable VCCO and VCCint; enable VCCaux and Vgg voltage regulator; drive CTR_SW to first state; assert CPT | Minimize power consumption of IOBs and CLBs | IOBs and CLBs disabled; capture dynamic data stored in CLB storage elements in CMCs; retain conf. data stored in CMCs |
| Four | Disable VCCO and VCCint; enable VCCaux and voltage regulator; drive CTR_SW to first state | Minimize power consumption of IOBs and reduce power consumption of CLBs | IOBs and all components of CLBs except non-selected storage elements disabled; switch power of selected CLB storage elements from VCCint to Vgg; retain dynamic data stored in selected storage elements of CLBs and conf. data stored in CMCs |

Power management unit 210 may also be used to re-apply power to different portions of the FPGA in a sequential manner when the FPGA transitions from standby mode to normal mode to avoid undesirably current spikes that may occur if power is simultaneously returned to all FPGA portions. In accordance with some embodiments of the present invention, the various components of the FPGA may be logically subdivided into a plurality of separate configurable portions, each of which may include one or more of the resources available on the FPGA. Gating circuits are used to couple each of the configurable portions to an associated power rail. The gating circuits are independently controlled by the power management unit so that power may be selectively and independently provided to each of the configurable portions. In this manner, the power management unit may sequentially power-down the configurable portions during standby mode, and may sequentially power-on the configurable portions when the FPGA returns to normal operation.

Figure 4:
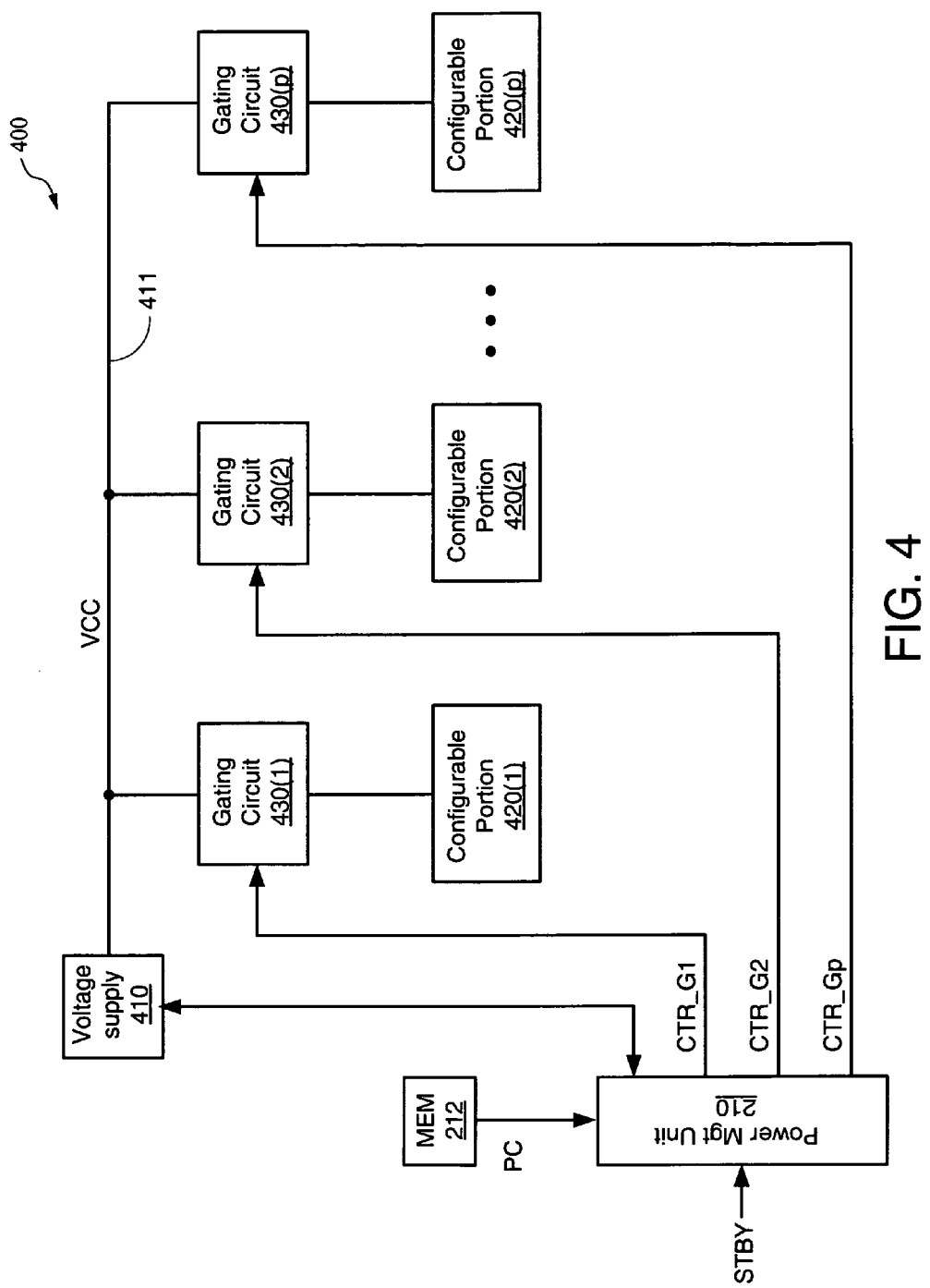
FIG. 4 is a block diagram illustrating a configurable power distribution system for other embodiments of the FPGA architecture of FIG. 1A.

For example, FIG. 4 shows a simplified functional block diagram of an FPGA in accordance with another embodiment of the present invention. FPGA 400 includes power management unit 210, memory circuit 212, a voltage supply circuit 410, a plurality configurable portions 420(1)-420(p), and a plurality of gating circuits 430(1)-430(p). Voltage supply circuit 410, which is well-known, provides an operating voltage VCC on power rail 411. Each configurable portion 420 may include any number of the device's resources. The granularity of the configurable portions 420 can range from arbitrarily small circuits to significant portions of the FPGA. The decision concerning the size of each programmable logic block is made by determining the desired trade-off between power savings, layout area overhead of the switch elements and the control circuit, and speed penalty. Thus, each configurable portion 420 may be selected to include one or more configuration logic blocks (CLBs), input/output blocks (IOBs), and/ or other resources of the FPGA (such as block RAM, processors, multipliers, adders, transceivers). Thus, for the exemplary embodiment of FIG. 4, the operating voltage VCC is representative of various operating voltages such as VCCO, VCCint, VCCaux, and/or Vgg that are provided to various FPGA components, for example, as described above with respect to FIG. 2.

Each configurable portion 420 includes a power terminal coupled to a first power terminal of a corresponding gating circuit 430, which includes a second power terminal coupled to power rail 411, and a control terminal to receive a corresponding gating control signal (CTR_G) from power management unit 210. For some embodiments, an asserted state of CTR_G causes the associated gating circuit 430 to couple the corresponding configurable portion 420 to power rail 411, thereby providing VCC to the configurable portion 420 to enable the configurable portion 420 to operate normally. Conversely, a de-asserted state of CTR_G causes the associated gating circuit 430 to de-couple the corresponding configurable portion 420 from power rail 411, thereby removing power from and thereby disabling the configurable portion 420.

Power management unit 210 may be configured to selectively assert the gating control signals CTR_G1-CTR_Gp in any suitable sequence in response to the PC signals stored in memory circuit 212. For example, when STBY is asserted, power management unit 210 uses the PC signals to sequentially de-assert the gating control signals CTR_G in a first order determined by the PC signals to sequentially power-down the configurable portions 420. For some embodiments, the PC signals may be set to a predetermined state that causes power management unit 210 to employ a well-known arbitration technique (e.g., fixed rotation, round-robin, and the like) to sequentially power-down configurable portions 420. Subsequently, when STBY is de-asserted and returns the FPGA to normal mode, power management unit 210 uses the PC signals to sequentially re-assert the gating control signals CTR_G in a second order determined by the PC signals to sequentially power-up the configurable portions 420. For some embodiments, the first and second orders may be the same. For other embodiments, the first and second orders may be different. For one embodiment, the second order may be the reverse of the first order. Thus, by sequentially providing and/or removing power from the various configurable portions 420 during transitions between normal mode and standby mode, embodiments of the present invention may avoid undesirable current spikes associated with simultaneously powering-up and/or powering-down all the configurable portions 420.

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

What is claimed is:

1. An integrated circuit, comprising:
   a first voltage supply circuit to provide a first operating voltage on a first power rail;
   a plurality of logic blocks each having a power terminal coupled to the first power rail;
   a second voltage supply circuit, separate from the first voltage supply circuit, to provide a second operating voltage on a second power rail;

a plurality of configuration memory cells each having a power terminal coupled to the second power rail;

a power configuration memory for storing one or more power configuration signals; and a power management unit having an input to receive a standby signal, a control terminal to receive the one or more power configuration signals, a first output to provide a first enable signal that selectively enables the first voltage supply circuit, and a second output to provide a second enable signal that selectively enables the second voltage supply circuit, wherein the power management unit comprises a state machine to selectively implement one or more power reduction techniques in response to the power configuration signals when the standby signal is asserted.

2. The integrated circuit of claim 1, wherein when the standby signal is asserted and the power configuration signals are in a first state, the power management unit is configured to de-assert the first enable signal to reduce the first operating voltage to a negligible level, and to de-assert the second enable signal to reduce the second operating voltage to a negligible level.

3. The integrated circuit of claim 2, wherein the power management unit further comprises a third output to provide a capture signal to the logic blocks and to a selected set of the configuration memory cells.

4. The integrated circuit of claim 3, wherein each of the logic blocks comprises:

at least one storage element having a data terminal coupled to a corresponding one of the selected set of the configuration memory cells and having a control terminal to receive the capture signal.

5. The integrated circuit of claim 3, wherein when the standby signal is asserted and the power configuration signals are in a second state, the power management unit is configured to de-assert the first enable signal to reduce the first operating voltage to a negligible level, to assert the second enable signal to provide the second operating voltage to the second power rail, and to assert the capture signal to capture dynamic data stored in the logic blocks in the selected set of the configuration memory cells.

6. The integrated circuit of claim 2, wherein each of the logic blocks comprises:

at least one storage element having a power terminal; and a switching circuit having a first power terminal coupled to the first power rail, a second power terminal coupled to the second power rail, a third power terminal coupled to the power terminal of the at least one storage element, and a control terminal to receive the first enable signal.

7. The integrated circuit of claim 6, wherein when the standby signal is asserted and the power configuration signals are in a second state, the power management unit is configured to de-assert the first enable signal to reduce the first operating voltage to a negligible level, and to assert the second enable signal to provide the second operating voltage to the second power rail;

wherein de-asserting the first enable signal causes the switching circuit to switch a connection of the power terminal of the at least one storage element of each of the logic blocks from the first power rail to the second power rail.

8. The integrated circuit of claim 2, further comprising:

a switching circuit having a first power terminal coupled to the first power rail, a second power terminal coupled to the second power rail, a third power terminal coupled to the power terminals of the configuration memory cells, and a control terminal to receive a switching control signal from the power management unit;

wherein when the standby signal is asserted and the power configuration signals are in a second state, the power management unit is configured to assert the first enable signal to provide the first operating voltage onto the first power rail, to de-assert the second enable signal to reduce the second operating voltage to a negligible level, and drive the switching control signal to a first state that causes the switching circuit to couple the power terminals of the configuration memory cells to the first power rail.

9. The integrated circuit of claim 8, wherein when the standby signal is not asserted, the power management unit is configured to assert the second enable signal to provide the second operating voltage to the second power rail, and to drive the switching control signal to a second state that causes the switching circuit to couple the power terminals of the configuration memory cells to the second power rail.

10. The integrated circuit of claim 1, further comprising:

a plurality of gating circuits, each having a first power terminal coupled to the first power rail, a second power terminal coupled to the power terminal of a corresponding logic block, and a control terminal to receive a corresponding gating control signal from the power management unit;

wherein assertion of each gating control signal causes the associated gating circuit to couple the power terminal of the corresponding logic block to the first power rail, and de-assertion of each gating control signal causes the associated gating circuit to de-couple the power terminal of the corresponding logic block from the first power rail.

11. The integrated circuit of claim 10, wherein the power management unit is configured to sequentially assert the gating control signals in a first order determined by the power configuration signals when the standby signal is asserted.

12. The integrated circuit of claim 11, wherein the power management unit is configured to sequentially de-assert the gating control signals in a second order determined by the power configuration signals when the standby signal is de-asserted.

13. The integrated circuit of claim 1, further comprising:

a third voltage supply circuit, separate from the first voltage supply circuit and the second voltage supply circuit, to provide a third operating voltage on a third power rail; and a plurality of input/output blocks each having a power terminal coupled to the third power rail;

wherein the power management unit further comprises a third output to provide a third enable signal that selectively enables the third voltage supply circuit.

14. The integrated circuit of claim 1, further comprising:

a regulator circuit coupled between the second voltage supply circuit and the second power rail.

15. A method of selectively reducing power consumption of an integrated circuit during a standby mode, the integrated circuit including a plurality of logic blocks coupled to a first power rail and including a plurality of configuration memory cells coupled to a second power rail, the method comprising:

providing a standby signal to a power management unit on the integrated circuit, wherein asserting the standby signal triggers the standby mode;

providing one or more power configuration signals to the power management unit; and when the standby signal is asserted, selecting one or more of a plurality of different power-reduction techniques to be implemented by the power management unit in response to the power configuration signals;

wherein the selecting comprises minimizing at least one of a first operating voltage on the first power rail and a second operating voltage on the second power rail; and wherein the selecting further comprises, when the power configuration signals are set to a first state, causing the power management unit to:

minimize the first operating voltage on the first power rail to power-down the logic blocks; and minimize the second operating voltage on the second power rail to power-down the configuration memory cells.

16. The method of claim 15, wherein the selecting further comprises, when the power configuration signals are set to a second state, causing the power management unit to:

minimize the first operating voltage on the first power rail to power-down the logic blocks;

enable the second operating voltage on the second power rail to operate the configuration memory cells;

generate a capture signal that causes dynamic data stored in one or more storage elements provided within the logic blocks to be captured by the configuration memory cells.

17. The method of claim 15, wherein the selecting further comprises, when the power configuration signals are set to a second state, causing the power management unit to:

minimize the first operating voltage on the first power rail to power-down the logic blocks;

switch a power terminal connection for one or more storage elements provided within the logic blocks from the first power rail to the second power rail; and enable the second operating voltage on the second power rail to power the configuration memory cells and the one or more storage elements provided within the logic blocks.

18. The method of claim 15, wherein the selecting further comprises, when the power configuration signals are set to a second state, causing the power management unit to:

enable the first operating voltage on the first power rail to power the logic blocks;

switch a power terminal connection for the configuration memory cells from the second power rail to the first power rail; and disable power circuitry associated with generating the second operating voltage to reduce the second operating voltage to a negligible level.

19. The method of claim 15, further comprising:

generating a plurality of gating signals;

selectively coupling each logic block of the integrated circuit to the first power rail using an associated gating circuit in response to a corresponding gating signal; and sequentially providing the gating signals to the corresponding gating circuits in an order defined by the power configuration signals.

\* \* \* \* \*